(12) United States Patent
Yasuda

(10) Patent No.: US 6,175,282 B1
(45) Date of Patent: Jan. 16, 2001

(54) METHOD FOR CALIBRATING A VCO CHARACTERISTIC AND AUTOMATICALLY CALIBRATED PLL HAVING A VCO

(75) Inventor: Takeo Yasuda, Shiga-ken (JP)

(73) Assignee: International Business Machines Corporation, Armonk, NY (US)

( * ) Notice: Under 35 U.S.C. 154(b), the term of this patent shall be extended for 0 days.

(21) Appl. No.: 09/416,215

(22) Filed: Oct. 8, 1999

(30) Foreign Application Priority Data

Oct. 9, 1998 (JP) .................................................. 10-287553

(51) Int. Cl.⁷ .............................. H03L 7/00; H03L 7/08; H03L 7/18; H03B 5/24

(52) U.S. Cl. ............................... 331/44; 331/14; 331/16; 331/17; 331/57; 331/177 R; 331/179

(58) Field of Search ................................. 331/14–18, 25, 331/44, 57, 179, 177 R

(56) References Cited

U.S. PATENT DOCUMENTS 3,694,766 * 9/1972 Boelke ................................... 331/11
5,382,922 * 1/1995 Gersbach et al. ..................... 331/1 A
5,408,196 * 4/1995 Sempel et al. ........................ 329/325

\* cited by examiner

*Primary Examiner*—David Mis
(74) *Attorney, Agent, or Firm*—Daryl K. Neff

(57) ABSTRACT

A method is disclosed for calibrating the oscillation frequency versus control voltage characteristic of a voltage controlled oscillator (VCO). The method includes establishing an oscillation frequency of the VCO at a maximum target frequency value ft_H (point Q) when the control voltage Vc equals a predetermined reference voltage Vref which lies within the operating range of the control voltage Vc, and verifying that the oscillation frequency becomes a minimum target frequency value ft_L when the control voltage Vc is changed to a value between the minimum value Vclamp_L and the reference voltage Vref. An automatically calibrated PLL circuit including a VCO is disclosed which performs a calibration to set the oscillation frequency versus control voltage characteristic of the VCO.

7 Claims, 10 Drawing Sheets

US 6,175,282 B1

METHOD FOR CALIBRATING A VCO CHARACTERISTIC AND AUTOMATICALLY CALIBRATED PLL HAVING A VCO

FIELD OF THE INVENTION

This invention relates to a device and method for calibrating an oscillation frequency versus a control voltage characteristic in a voltage controlled oscillator (VCO), wherein the oscillation frequency is changed by the control voltage.

BACKGROUND OF THE INVENTION

FIG. 9 is a basic circuit diagram of a phase locked loop (PLL) circuit 30 using a VCO 20. In the VCO 20, an oscillation frequency fo of an output signal line 42 can be changed by a control voltage Vc input, that is, a control voltage line 46. Generally, in the PLL circuit 30, a phase frequency comparator 26 detects a phase difference between a signal (fo/N) obtained by dividing the oscillation frequency fo output from the VCO 20 by N with a variable frequency divider 22 and a signal (fi/D) obtained by dividing a reference frequency fi input from an input signal line 44 by D with a variable frequency divider 24. To eliminate this phase difference, the control voltage Vc is fed back to the VCO 20 through a charge pump 32.

In this feedback loop, however, if an initial value of control voltage Vc of the VCO 20 or an initial oscillation frequency of the VCO 20 is far from a target frequency ft whose minimum value is ft_L and whose maximum value is ft_H, it will cause a problem that a frequency of an output signal does not correspond with that of an input signal, that is, a problem of unlocking of the PLL. Therefore, a range of Vc (the minimum value is Vclamp_L and the maximum value is Vclamp_H) is controlled in a clamp circuit 34 or the like so that an initial value of the control voltage Vc is not far from the predetermined range. In a conventional method, voltage is corrected in a charge pump 32 so as to oscillate in the middle frequency of the predetermined frequency range when control voltage Vc is the middle of its voltage range.

However, as shown by a characteristic curve in FIG. 10, even if voltage is calibrated only with the charge pump 32, a clamp range (Vclamp_L~Vclamp_H) of the control voltage Vc does not necessarily cover a whole range of target frequency ft (ft_L~ft_H). In the circuit, only the charge pump 32 in the feedback loop can control oscillation frequency fo, therefore, if a characteristic curve of the VCO 20 goes into a too-fast zone or to too-slow zone due to such as process variation, VCO 20 can not oscillate in the required frequency.

As shown by a characteristic curve in FIG. 10, if the VCO 20 has a nonlinear characteristic, the VCO 20's response can be changed according to its operating point. Therefore, the locking time of the PLL varies widely. Moreover, the clamp voltage can be changed by itself. Therefore, considering all these factors, it is necessary to set the most suitable oscillation characteristic of the VCO 20 by adjusting an operating point at the maximum or the minimum frequency (ft_L, ft_H) of the target frequency ft.

Therefore, it is an object of the present invention to calibrate an oscillation frequency versus a control voltage characteristic in a VCO so that the VCO can oscillate in a target frequency securely within a control voltage range.

SUMMARY OF THE INVENTION

Accordingly, according to a first aspect of the invention, a method is provided for calibrating an oscillation frequency versus a control voltage characteristic of a voltage controlled oscillator (VCO). The method includes performing a calibration to establish an oscillation frequency of the VCO at a maximum target frequency value when a control voltage input to the VCO reaches a predetermined reference voltage, and then verifying that the control voltage is within a predetermined operating range when the oscillation frequency is established at a minimum target frequency value.

Preferably, the calibration is performed by automatically setting a calibration value within the VCO. The calibration value is preferably set by initially providing a calibration value, then altering the calibration value incrementally until the control voltage reaches the predetermined reference voltage.

According to another aspect of the invention, a method is provided for calibrating an oscillation frequency versus a control voltage characteristic in a voltage controlled oscillator (VCO) used in a phase-locked loop (PLL) circuit in which a control voltage is fed back to the VCO to eliminate a phase difference between a) a signal obtained by dividing the output frequency signal of the VCO signal by a divide ratio N and b) a signal obtained by dividing a reference frequency input signal by a divide ratio D. According to this aspect of the invention, the method includes selecting divide ratios N and D such that the oscillation frequency is established at a maximum target frequency value; initializing an oscillation frequency versus a control voltage characteristic at a minimum value of a control voltage while maintaining the oscillation frequency at the maximum target frequency value; and while maintaining the oscillation frequency at the maximum target frequency value, setting a calibration value to increase the control voltage from the minimum value to a predetermined reference voltage, thereby calibrating the oscillation frequency versus control voltage characteristic of the VCO. Preferably, after setting the calibration value, divide ratios N and D are selected such that the oscillation frequency is established at a minimum target frequency value, and the control voltage is verified to be within an operating range.

According to a further aspect of the invention, an automatically calibrated phase locked loop (PLL) circuit including a voltage controlled oscillator (VCO) is provided. The PLL circuit invention includes a voltage controlled oscillator (VCO) arranged in a phase-locked loop (PLL), wherein the VCO provides an oscillation frequency as output, and the oscillation frequency is phase compared in proportion to a reference frequency to provide a control voltage as a feedback input to said VCO for controlling the oscillation frequency. In addition, the PLL circuit invention includes a calibration controller which provides a calibration value to the VCO to control an oscillation frequency versus control voltage characteristic of the VCO, wherein the calibration controller automatically adjusts the calibration value such that the oscillation frequency is established either at a minimum target frequency value or at a maximum target frequency value when the control voltage reaches a predetermined reference voltage.

DETAILED DESCRIPTION OF THE PREFERRED EMBODIMENTS OF THE INVENTION

Embodiments of the method for calibrating a VCO characteristic according to the present invention will be described below with reference to the accompanying drawings.

Figure 1:
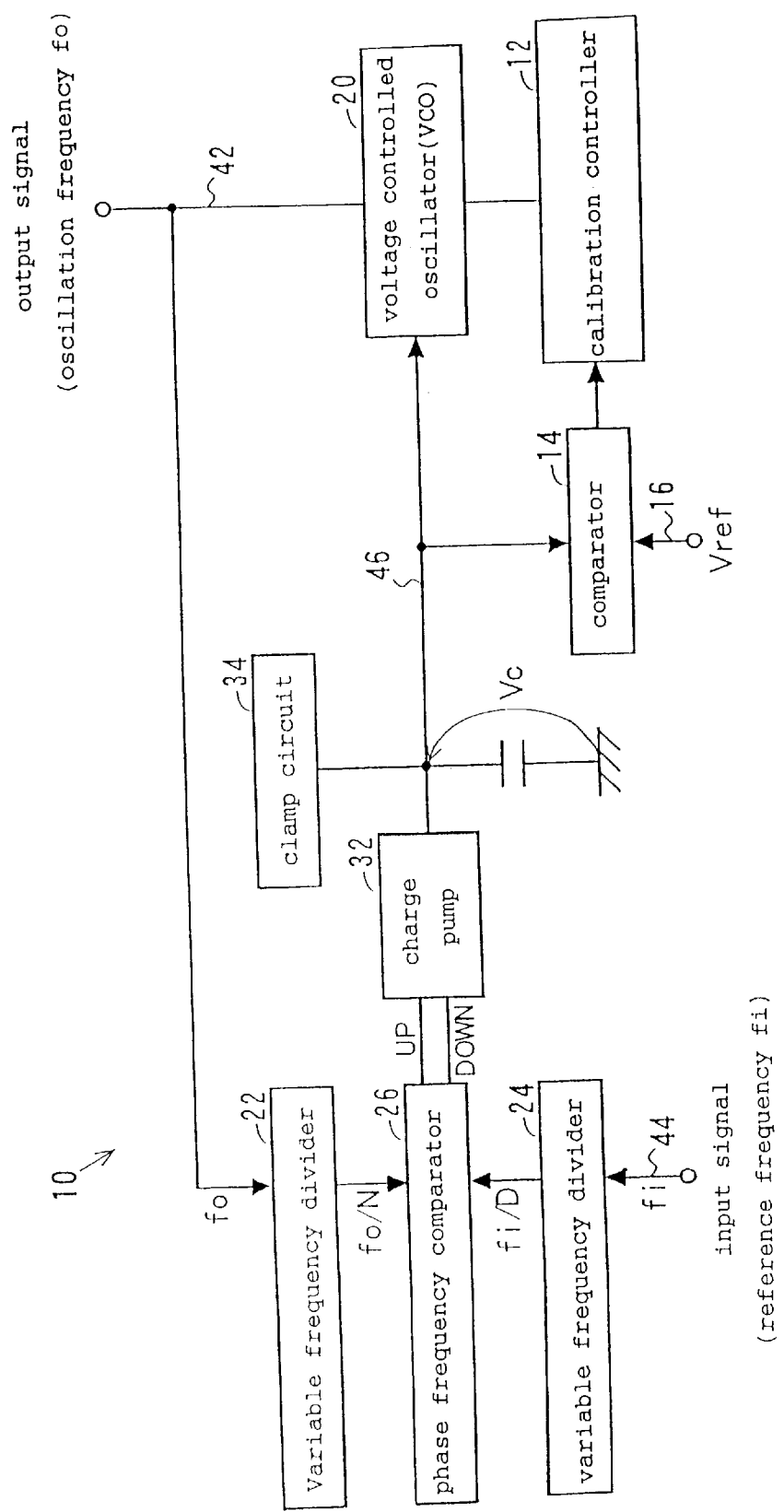
FIG. 1 is a circuit diagram illustrating an embodiment of a PLL circuit having a VCO in which the oscillation frequency versus the control voltage characteristics is calibrated by using a calibration method of the present invention.

FIG. 1 shows a PLL circuit 10 having a comparator 14 and a calibration controller 12, which calibrate an oscillation frequency versus control voltage characteristic of a VCO according to the present invention. A control voltage Vc is input from a control voltage line 46 to the comparator 14, while a reference voltage Vref is input from a reference voltage input line 16 to the comparator 14. The comparator 14 makes the high-low comparison between the control voltage Vc and the reference voltage Vref. When the high-low relation between them is reversed, the comparator transmits it to the calibration controller 12. In the present embodiment, the control voltage Vc is lower than the reference voltage Vref at first, and then when the control voltage Vc gets larger than the reference voltage Vref, the comparator inverts its output to the controller 12. The calibration controller 12 provides a calibration value to the VCO for calibrating an oscillation frequency fo versus a control voltage Vc characteristic in the VCO 20, in accordance with the present invention. Variable frequency dividers 22 and 24, phase frequency comparator 26, charge pump 32, clamp circuit 34 and the like are similar to the ones used in a conventional PLL circuit 30.

Figure 2A:
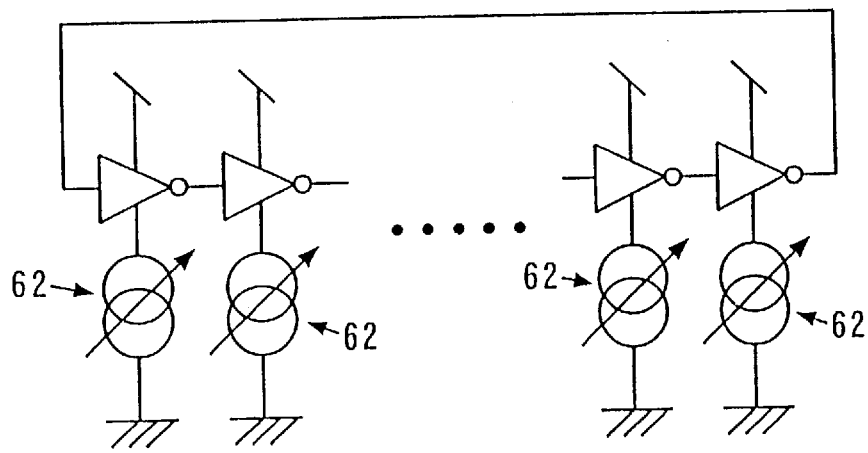
FIGS. 2(a) and 2(b) are schematic circuit diagrams illustrating an embodiment of the VCO frequency control part.
Figure 2B:
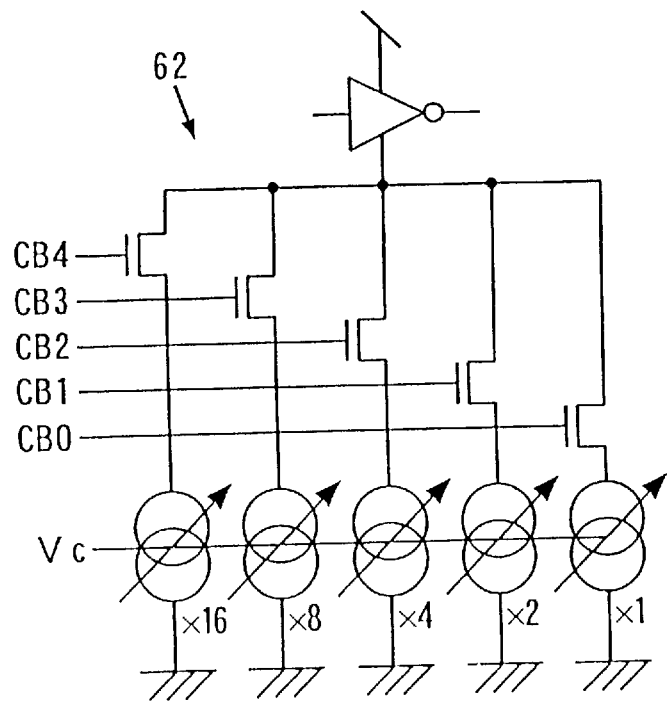

A schematic diagram of the frequency control portion of a ring-oscillator type of VCO 20 is illustrated in FIG. 2 (a). In such VCO 20, a ring oscillator formed of inverters 64 coupled to voltage controlled variable current sources 62 determines the oscillation frequency fo of the VCO in accordance with the control voltage input Vc which is provided thereto. A detailed view of a variable current source 62 for one inverter stage of the ring oscillator type VCO 20 is illustrated in FIG. 2($b$). Each variable current source 62 comprises a field effect transistor (FET) which receives a calibration value CB0–CB4, and weighted current sources X1, X2, X4, X8 and X16 which vary their current according to the analog control voltage Vc. The calibration value includes calibration bits CBn (n=0,1,2,3,4) which are each input to a FET gate connected to a weighted current source having a current output value of $X2^n$.

In this circuit, ideally, the oscillation frequency fo of VCO 20 changes in proportion to the output current of an inverter 64. Ideally, the oscillation frequency fo should change linearly with respect to changes in the output current of the variable current source 62. With the present invention, the oscillation frequency fo is controlled linearly with respect to both the voltage Vc output from the charge pump 32 and the calibration value.

Figure 3:
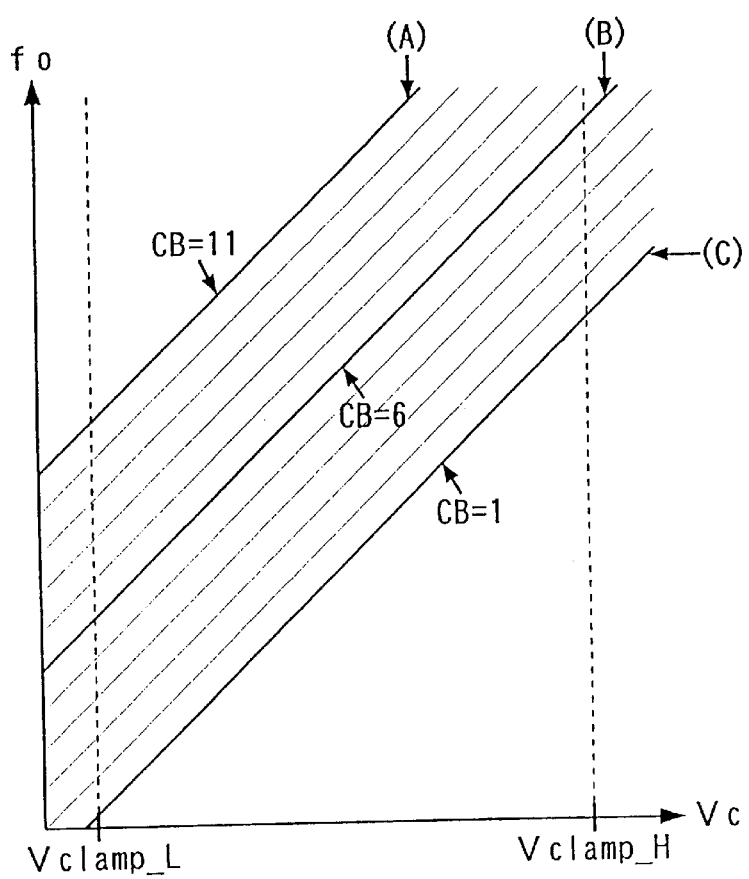
FIG. 3 is a characteristic curve diagram illustrating a relation between the calibration value and the characteristic curve.

The calibration value used herein is a value which represents a calibration status of an oscillation frequency fo versus a control voltage Vc characteristic at each stage. If there are 11 calibrating stages, a characteristic curve can be calibrated as shown in FIG. 3. In this case, a calibration value (CB) can be calibrated from 1 to 11. When the calibration value is maximized (CB=11), the characteristic curve is set to (A), and when the calibration value is minimized (CB=1), the characteristic curve is set to (C). When the calibration value is the center value (CB=6), the characteristic curve is set to (B). For this reason, an oscillation frequency fo versus a control voltage Vc characteristic can be calibrated by stages within a range from the characteristic curve A to the characteristic curve C by changing the calibration value.

When the calibration value increases, keeping a control voltage within a certain control voltage range (for example, Vclamp_L to Vclamp_H), the oscillation frequency fo rises throughout the control voltage range, and when the calibration value decreases, the oscillation frequency decreases throughout the control voltage range. Accordingly, when the calibration value increases (or decreases) one by one for a certain constant control voltage Vc, the oscillation frequency fo can be increased (or decreased) by a fixed frequency amount. Thus, the oscillation frequency fo can be controlled linearly by the calibration value. In the present embodiment, the calibration value can be changed within a range of 1 to 31, and when the calibration value increases, the oscillation frequency fo increases throughout the control voltage range.

Figure 4:
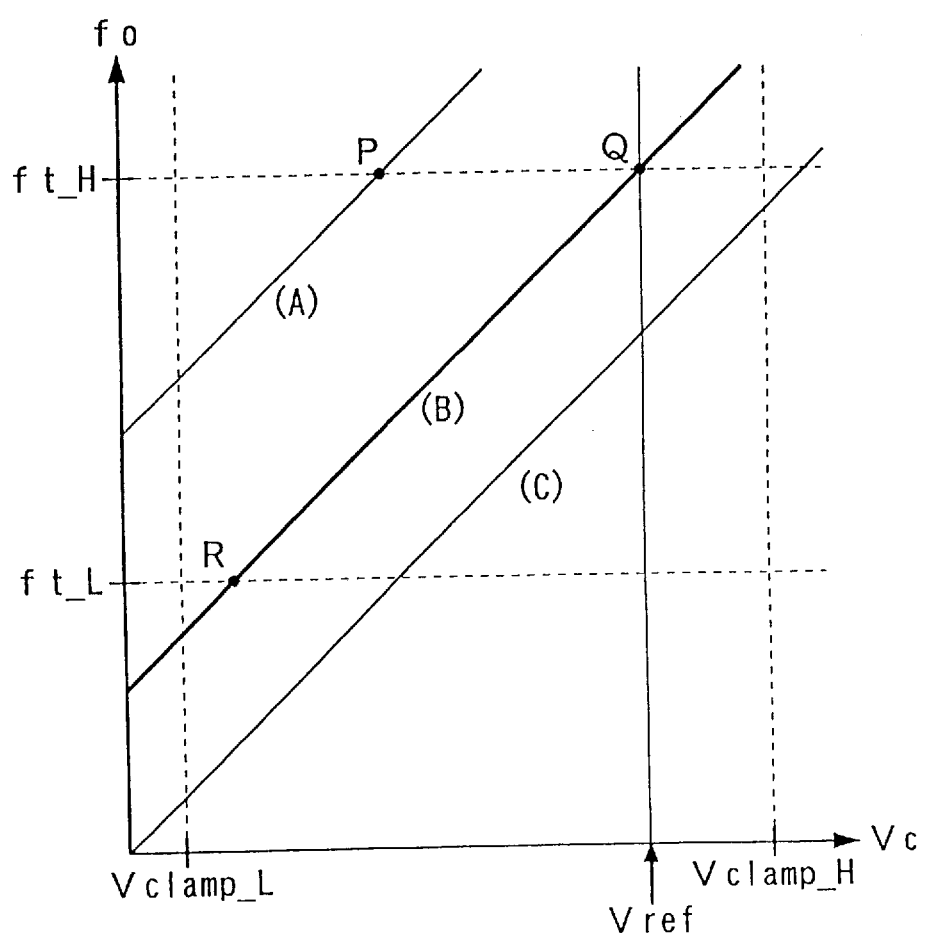
FIG. 4 is a characteristic curve diagram illustrating a process outline of the calibration method of the present invention.

An ideal oscillation frequency fo versus a control voltage Vc characteristic in the VCO 20 is shown in FIG. 4. The characteristic curves (A), (B) and (C) are plots of the oscillation frequency fo versus the control voltage Vc characteristic in the VCO 20 for different calibration values. Curve (A) is a characteristic curve when a calibration value is maximum value. Curve (B) is a characteristic curve when a calibration value is optimum value, and curve (C) is a characteristic curve when a calibration value is minimum value.

The oscillation frequency fo of the VCO 20 when it is used in the PLL can be represented by the following formula by using a reference frequency fi and divide ratios N and D of variable frequency dividers 22 and 24:

$$fo = (N/D) \times fi$$

When the PLL including the VCO 20 is working, the control voltage Vc is adjusted so that the control voltage Vc compensates for the change of the calibration value. The oscillation frequency fo in the VCO 20 is determined by the divide ratios N and D, independently of the calibration value.

Next, the process of calibrating an oscillation frequency fo versus an control voltage Vc characteristic in the VCO by using the calibration method of the present invention is described. The VCO characteristic is calibrated by using the comparator 14 and the calibration controller 12.

Figure 5:
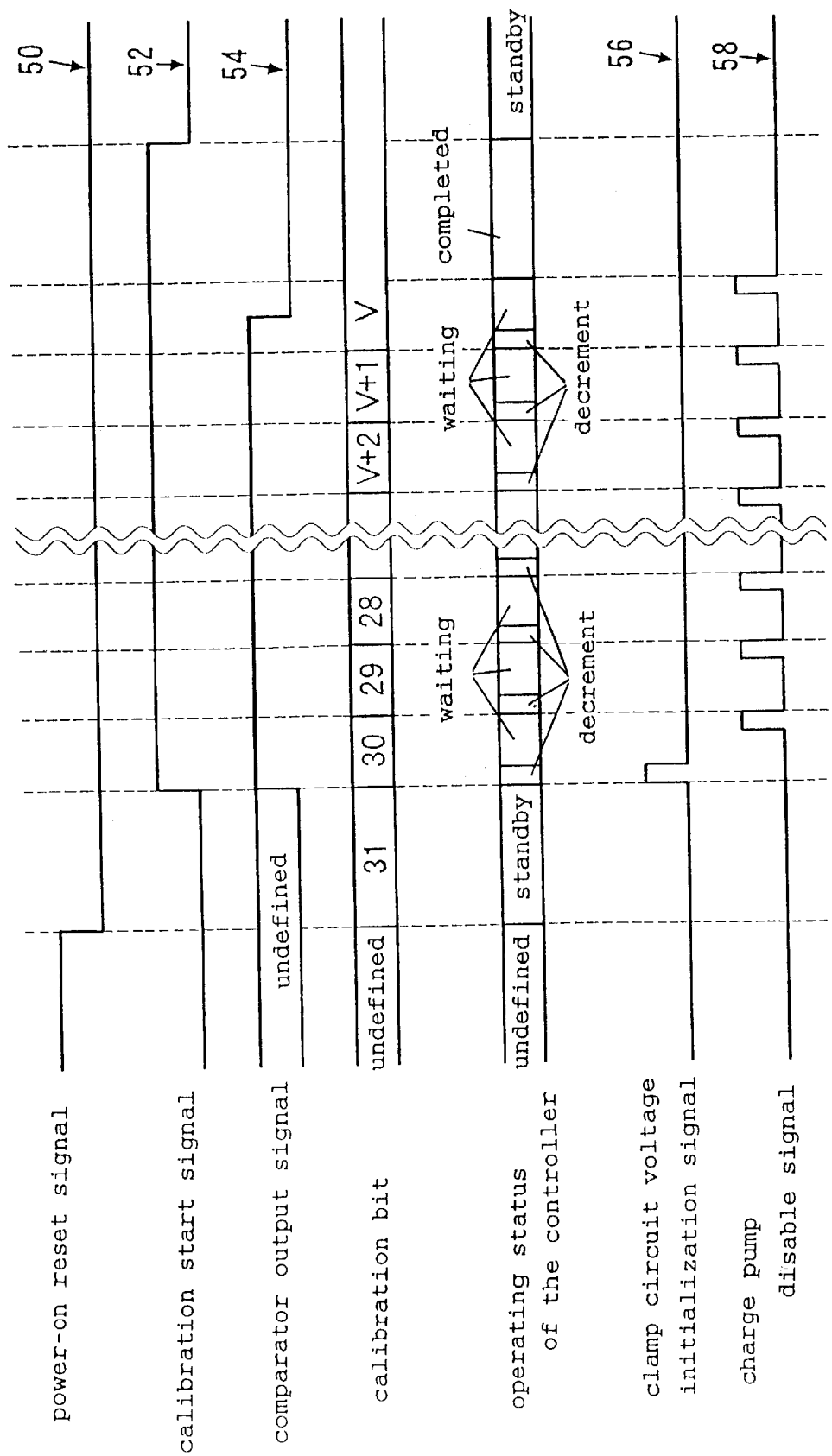
FIG. 5 is a timing diagram illustrating a process outline of the calibration method of the present invention.
Figure 6:
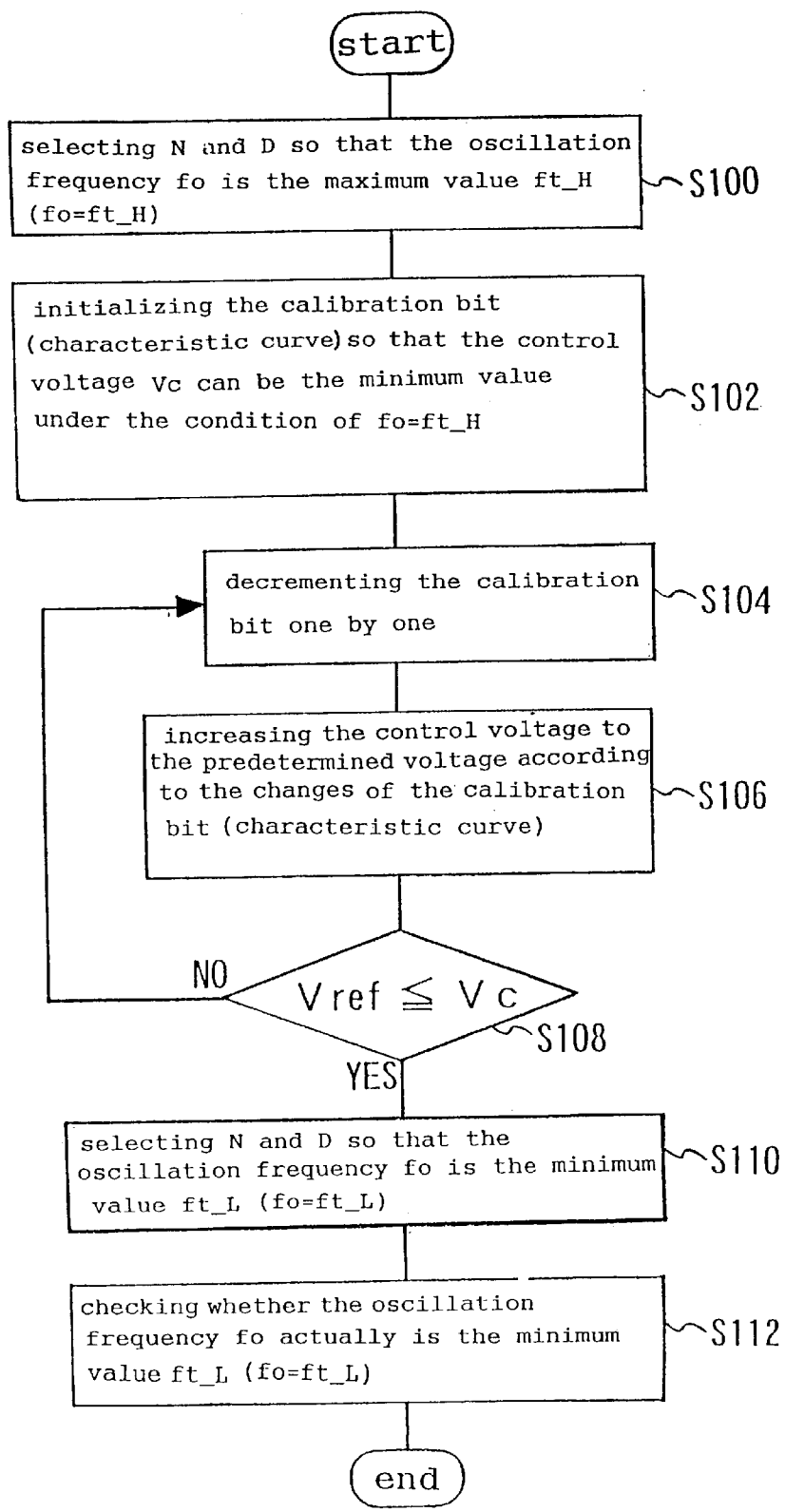
FIG. 6 is a flowchart illustrating a process outline of the calibration method of the present invention.

A timing diagram for the calibration process is shown in FIG. 5, and a flowchart showing steps in the calibration process is shown in FIG. 6. As illustrated in FIGS. 5 and 6, the VCO 20 starts to oscillate by receiving a kick pulse (not shown) which is a pulse transmitted on the trailing edge 66 of power-on-reset signal 50. The kick pulse is generated when the circuit is switched on or when the circuit recovers from the power-save-mode. Then, the divide ratios N and D are selected so that the oscillation frequency fo is the maximum value (ft_H) of the target frequency for the input signal (the reference frequency fi) (ex. if the reference frequency fi is 40 MHz and the target frequency ft is 135 to 270 MHz, N D=135 20) (block S100). In the meantime, the oscillation frequency versus the control voltage characteristic is initialized (the calibration value is set to the maximum). Then the control voltage is set to its minimum value by keeping the oscillation frequency fo its maximum value ft_H (block S102). At this time, the status of the VCO 20 is represented by point P on the characteristic curve A as shown in FIG. 4.

After that, when a calibration-start signal 52 becomes active (high), a clamp circuit 34 starts working by a voltage initialization signal 56 of the clamp circuit 34, and then the calibration value is decremented one by one (block S104).

Under the initialized condition of the calibration controller 12, the calibration value is the maximum value 31 ('11111') and then it is decremented one by one.

At this time, as the reference frequency fi of the input signal and N and D of the variable frequency dividers 22 and 24 are constant, the oscillation frequency fo stays at the maximum value ft_H of the target frequency, but only the control voltage Vc increases (block S106). In other words, the state of the VCO 20 varies linearly from the point P toward the point Q in FIG. 4.

The comparator 14 compares the control voltage Vc and the reference voltage Vref. The calibration controller 12 receives the output 54 of comparator 14 as its input. And it continues decrementing the calibration value until the control voltage Vc reaches to the reference voltage Vref (block S108). After the calibration value is decremented, there is a wait time of about 1 msec as a stabilization period before the comparator compares the control voltage Vc and the reference voltage Vref. When the output of the comparator 14 is valid after the wait time, a pulse signal 58 temporarily disables the charge pump 32. Disabling the charge pump 32 prevents voltage variations generated by its charge-pumping operation from affecting operation of the comparator 14.

The process of decrementing the calibration value completes when the control voltage reaches the reference voltage Vref, namely, at the point Q in FIG. 4. The calibration controller 12 holds the calibration value at the point Q which is obtained when the control voltage Vc reaches the reference voltage Vref.

The same reference voltage source that determines the highest value and the lowest value of the control voltage Vc (i.e. the values Vclamp_H and Vclamp_L, respectively) is used to generate the reference voltage Vref. Preferably, the value of Vref is so set that it is lower by about 0.05 V to 0.20V margin than the value of Vclamp_H. Because the same voltage source determines these voltages, the reference voltage Vref matches well the clamp voltage, and it is always between Vclamp_L and Vclamp_H, notwithstanding process variations which may occur during fabrication of the PLL circuit as an integrated circuit. In other words, since these voltages match well against process variation, the control voltage Vc can always reach the reference voltage Vref even if the process variations are large. Furthermore, there is still a margin between the reference voltage Vref (at point Q) and the highest value of the control voltage Vclamp_H. Here the reference voltage Vref (at point Q) is the VCO's control voltage when it's the oscillation frequency fo is the highest value ft_H of the target frequency, and Vclamp_H is the upper limit of the control voltage to reach.

Then, the calibration value is stored when the VCO's control voltage Vc reaches the Vref. While this calibration value is maintained, the oscillation frequency fo is set up so that it becomes the lowest value ft_L of the target frequency by changing the divide ratios N and D (ex. in a case of fi=40 MHz and ft=135~270 MHz, N D=135 40) (block S110). At this time, the VCO 20 changes from point Q toward point R on the characteristic curve (B) in FIG. 4.

If the oscillation frequency fo is actually reduced to the lowest value ft L of the target frequency of the VCO 20 while the calibration value is kept in the above-mentioned value, the characteristic of VCO 20 is correctly calibrated. (block S112) In general, the clamp voltage range is set up widely enough with an adequate margin. Therefore, whenever the highest frequency ft_H is set up correctly, the lowest frequency ft_L can be achieved without any problems.

In the state of point R, there is still a margin of Vc-Vclamp_L until it reaches to the lowest value Vclamp_L. In other words, the margin to the highest value and the margin to the lowest value of the control voltage Vc can be changed by the reference voltage Vref. Specifically, the VCO can oscillate throughout the target frequency range from ft_L to ft_H with enough margin for the range from Vclamp_L to Vclamp_H of the control voltage Vc.

Figure 7:
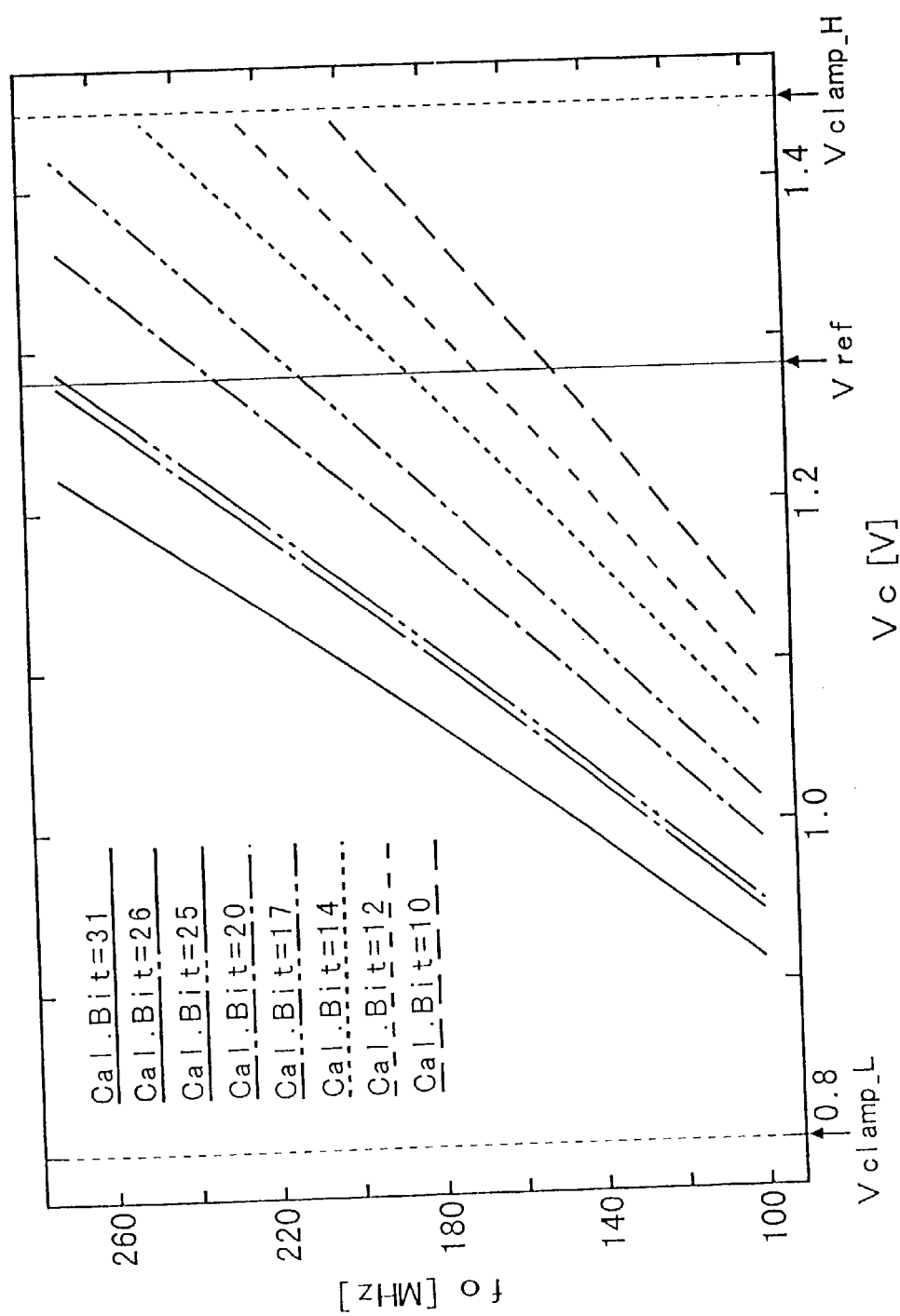
FIG. 7 is a characteristic curve diagram illustrating an outline of a process obtained by a measurement when the calibration method of the present invention is applied to a VCO of an HDD channel.

The calibration method of the present invention can be preferably applied to a VCO which is used for a PLL in a channel large scale integrated circuit (LSI) of a hard disk drive (HDD). The hard disk is divided into several bands (for example, 8 bands) in the direction of the radius of the disk, and the frequency of the PLL (VCO) is constant in the same band. However, it is changed whenever a head is moved to a different band area. The frequency of the outermost band is about twice as high as that of the innermost band, and the frequency for each band is assigned in proportion to the band location within a range between the frequency of the outermost band and that of the innermost band. Therefore, it is necessary that the VCO should be able to cover the whole frequency range by calibration. Results of the measurements made on VCO characteristic curves of HDD channel by applying this method are shown in FIG. 7. By measurement of this sample, following values are given, that is, Vref= 1.28V, Vclamp_L=0.80V, Vclamp_H=1.45V, and the required operating range (target frequency range) is between 135 MHz and 270 MHz. As for this sample, it is found that the required operating range can be covered successfully because the control voltage Vc reaches to the reference voltage Vref when the calibration value (Cal. Bit) is 25. In every measurement made on various lock frequencies within the target frequency ft range, locking time is within several hundreds of sec and time variation is very little. At that time, a standard deviation of clock jitter is 40 psec, which is about 1.1% of a 270 MHz cycle time. The control parts which are appended inside the PLL are only switches and a comparator, which means only 10% or less area of the whole PLL area was increased.

By using the calibration method of the present invention, a band frequency can be securely controlled without trimming it by using an intricate and costly fuse. Additionally, since the VCO can operate linearly within a desired frequency range, the frequency can be switched to a different band quickly and securely. Thus, wait time for locking the PLL and corresponding wasting of disk storage areas due to the wait time can be reduced.

In the method for calibrating a VCO characteristic according to the present invention, a VCO characteristic is calibrated so that the frequency of the output signal is established at the highest value ft_H of the target frequency when the control voltage Vc reaches the reference voltage Vref. In addition, the present method also verifies that the lowest frequency ft_L is within the operating range of the control voltage Vc. In this manner, the highest and the lowest output frequencies of the VCO (ft_L and ft_H) can be obtained by a control voltage Vc within the designated operating range (Vclamp_L to Vclamp_H), thereby assuring that the PLL can be securely locked. By applying the above calibration method, it is easier to design a VCO so as to improve its linear characteristic. That is, because if it is known that the VCO oscillates at the highest frequency ft_H when the control voltage Vc reaches the reference voltage Vref, the design specification can be clarified and requirements for design can be reduced. When the linearity characteristic of the VCO is improved, locking time can be shortened and made more uniform, irrespective of the operating point.

Furthermore, it is sufficient that the calibration is carried out only once after resetting immediately after a power-on or after resetting immediately after recovering from a power-save-mode. During a normal operating period of PLL after the calibration, the calibration value is held at the value which is obtained when the control voltage Vc reaches the predetermined reference voltage Vref in a state that the frequency is at the maximum value ft_H. As long as the calibration value is held at the above value, the calibration controller 12 or the comparator 14 in the PLL can be switched off during the normal operating period, so that power consumption can be reduced.

Figure 8:
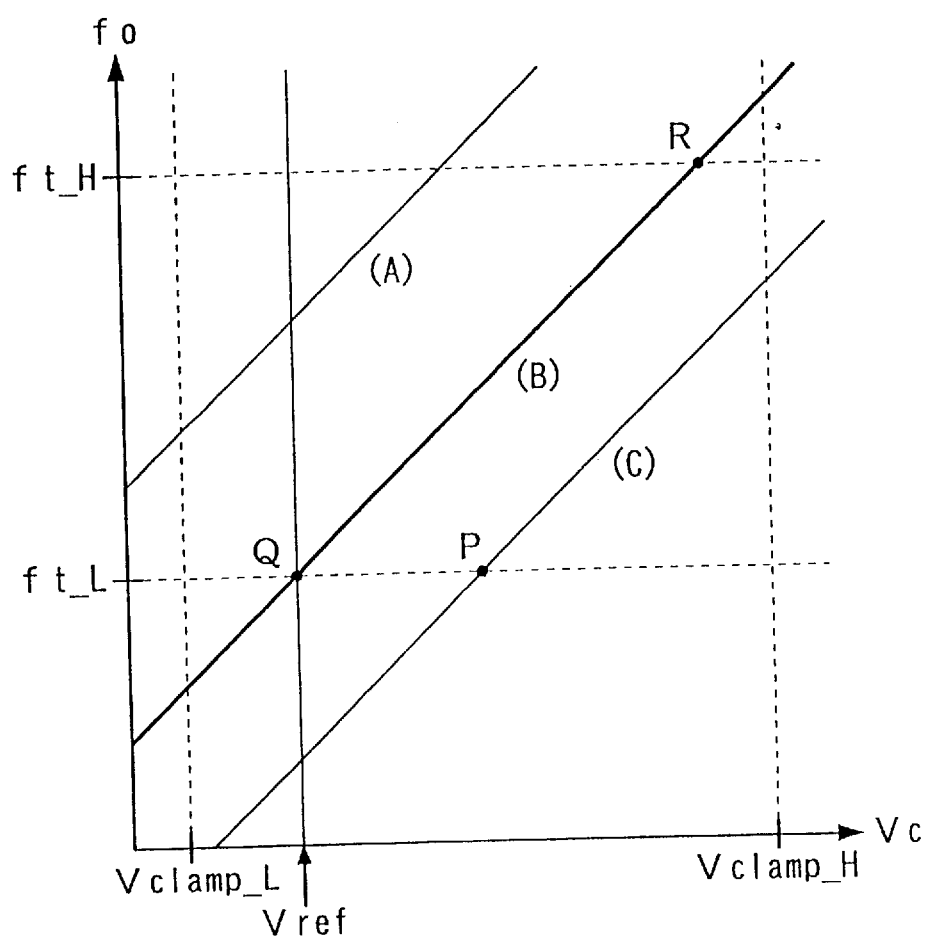
FIG. 8 is a characteristic curve diagram illustrating another process outline of the calibration method of the present invention.
Figure 9:
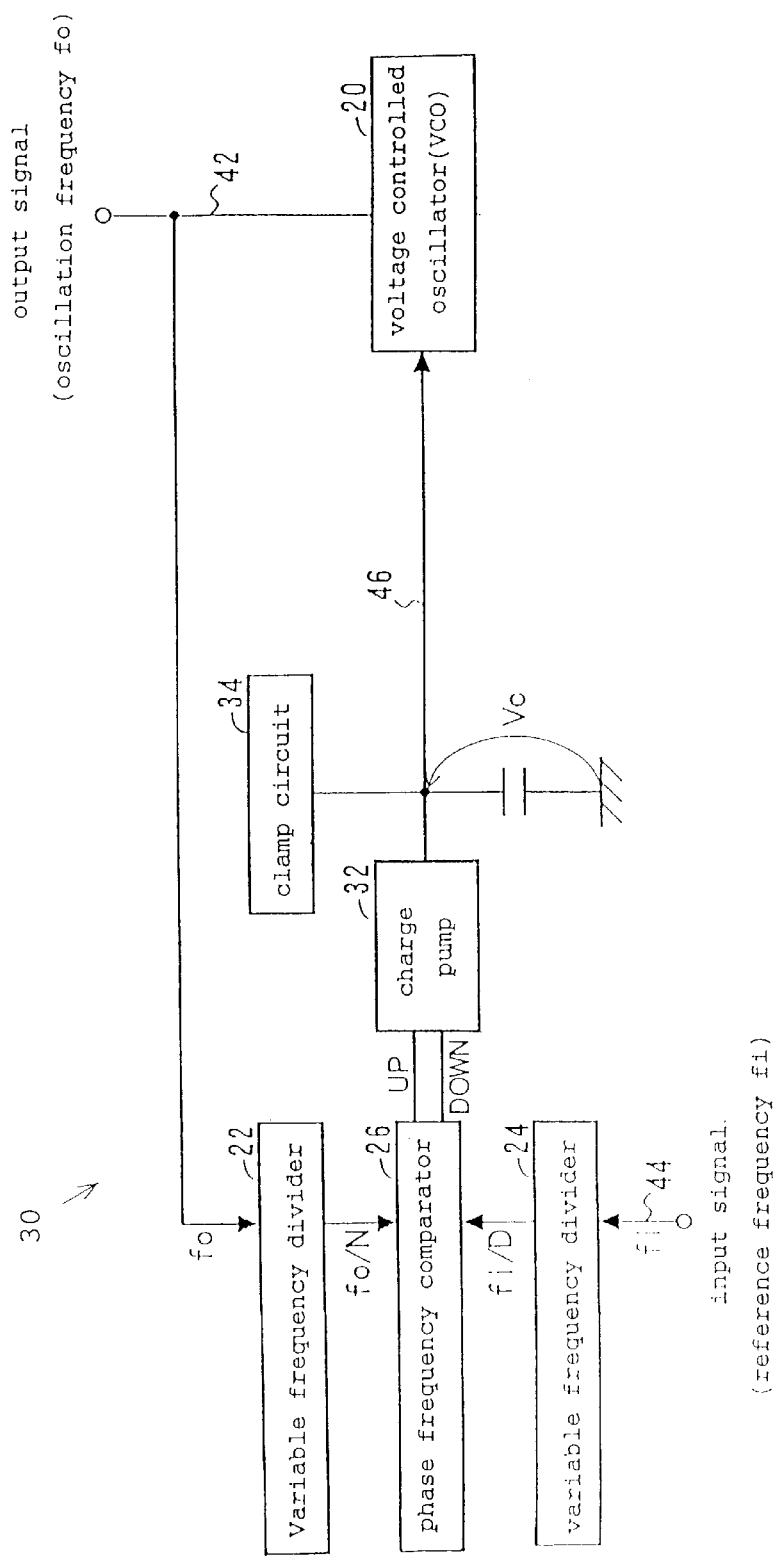
FIG. 9 is a circuit diagram illustrating an example of a PLL circuit with a conventional VCO.
Figure 10:
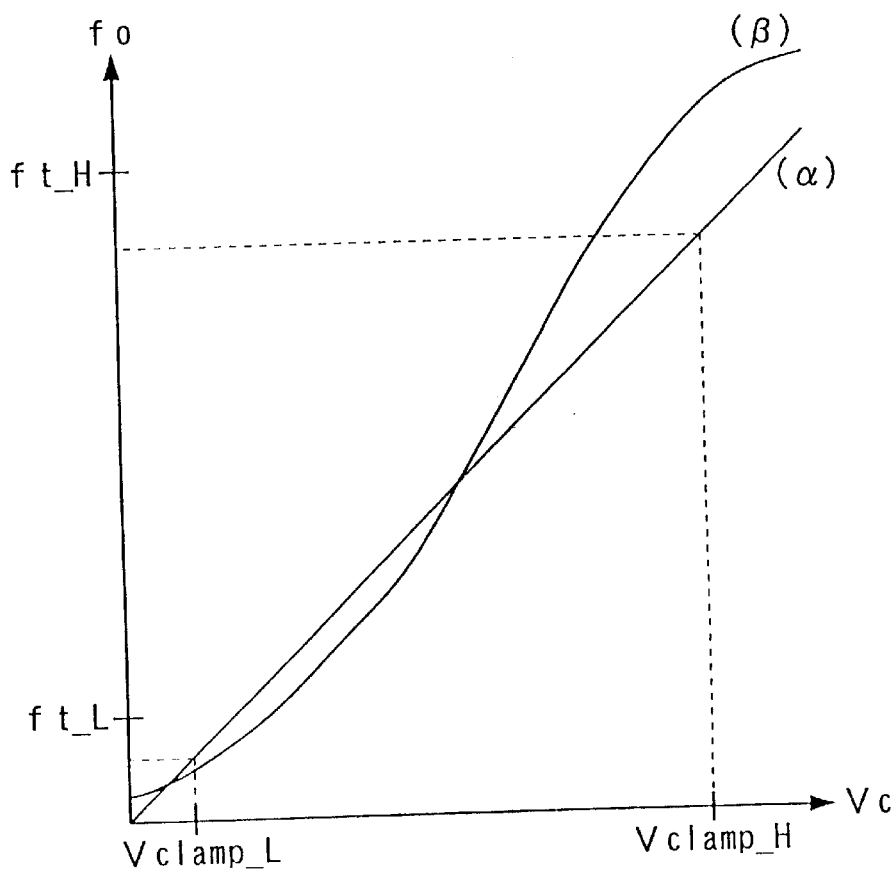
FIG. 10 is a characteristic curve diagram illustrating an example of the oscillation frequency versus the control voltage characteristic of a conventional VCO.

A practical embodiment of the present invention has thus been described. However, it will be understood that the method for calibrating a VCO characteristic can also be implemented in accordance with other embodiments. For example, as illustrated in FIG. 8, a calibration can also be carried out so that the oscillation frequency fo becomes the minimum value of target frequency ft_L when the control voltage Vc equals the reference voltage Vref. In this case, the calibration is carried out in reverse order to the above-described embodiment. In this embodiment, the divide ratios N and D are initially selected so that the oscillation frequency fo becomes the minimum value ft_L of the target frequency range, while the calibration value is set to the minimum value such that the initial operating point of the VCO is at point P in FIG. 8. Then, the calibration value is incremented gradually until the control voltage Vc reaches the reference voltage Vref (at point Q). After that, while the calibration value is held constant, the divide ratios N and D are updated so that the oscillation frequency fo becomes the maximum value of the target frequency (ft_H). After checking that the oscillation frequency fo is increased up to ft_H, the calibration process is completed.

By using the method of calibrating a VCO characteristic according to the present invention, a characteristic curve of an oscillation frequency versus a control voltage in the VCO can be calibrated so that the VCO can oscillate throughout the required target frequency range versus a limited control voltage which lies within a required operating range. In addition, the calibration can be carried out so that the oscillation frequency becomes the maximum value or the minimum value of target frequency, when the control voltage reaches a predetermined reference voltage. Then, since the value of the control voltage is a predetermined, known value (the reference voltage) when the oscillation frequency becomes the maximum value or the minimum value of the target frequency, a circuit with a highly linear and stable characteristic can be designed and the operating range on the VCO characteristic curve can be verified.

Based on the accompanying drawings, practical embodiments of the method for calibrating a VCO characteristic according to the present invention have been described. However, the present invention is not limited to the illustrated method. It will be apparent to those skilled in the art that various changes, improvements, and modifications can be made thereto without departing from the spirit or scope of the invention.

What is claimed is:

1. A method for calibrating an oscillation frequency versus a control voltage characteristic of a voltage controlled oscillator (VCO) in which an oscillation frequency is changed responsive to a control voltage Vc, comprising:

performing a calibration to establish an oscillation frequency of said VCO at a maximum target frequency value when a control voltage input to said VCO reaches a predetermined reference voltage; and verifying that said control voltage is within a predetermined operating range when said oscillation frequency is established at a minimum target frequency value.

2. The method according to claim 1 wherein said calibration is performed by automatically setting a calibration value within said VCO.

3. The method of claim 2 wherein said calibration value is set by initially providing a calibration value, then altering said calibration value incrementally until said control voltage reaches said predetermined reference voltage.

4. A method for calibrating an oscillation frequency versus a control voltage characteristic in a voltage controlled oscillator (VCO) used in a phase-locked loop (PLL) circuit in which a control voltage is fed back to the VCO to eliminate a phase difference between a) a signal obtained by dividing the output frequency signal of the VCO signal by a divide ratio N and b) a signal obtained by dividing a reference frequency input signal by a divide ratio D, comprising:

selecting divide ratios N and D such that said oscillation frequency is established at a maximum target frequency value;

initializing an oscillation frequency versus a control voltage characteristic at a minimum value of a control voltage while maintaining said oscillation frequency at said maximum target frequency value; and while maintaining said oscillation frequency at said maximum target frequency value, setting a calibration value to increase said control voltage from said minimum value to a predetermined reference voltage, thereby calibrating said oscillation frequency versus control voltage characteristic of said VCO.

5. The method of claim 4 further comprising, after setting said calibration value, selecting said divide ratios N and D such that said oscillation frequency is established at a minimum target frequency value, and verifying that said control voltage is within an operating range.

6. An automatically calibratable phase locked loop (PLL) circuit including a voltage controlled oscillator (VCO), comprising:

means for calibrating an oscillation frequency versus control voltage characteristic of said VCO such that said oscillation frequency is established at a maximum target frequency value when a control voltage input to said VCO is set to a predetermined reference voltage lying within an operating range of said control voltage; and means for verifying that said control voltage lies within said operating range when said oscillation frequency is established at a minimum target frequency value.

7. An automatically calibrated phase-locked loop (PLL) circuit including a voltage controlled oscillator (VCO) comprising:

a voltage controlled oscillator (VCO) arranged in a phase-locked loop (PLL), said VCO providing an oscillation frequency as output, said oscillation frequency being phase compared in proportion to a reference frequency to provide a control voltage as a feedback input to said VCO for controlling said oscillation frequency; and a calibration controller providing a calibration value to said VCO to control an oscillation frequency versus control voltage characteristic of said VCO, said calibration controller automatically adjusting said calibration value such that said oscillation frequency is established either at a minimum target frequency value or at a maximum target frequency value when said control voltage reaches a predetermined reference voltage.

* * * * *